US009595560B2

(12) United States Patent
Wan et al.

(10) Patent No.: US 9,595,560 B2
(45) Date of Patent: *Mar. 14, 2017

(54) PUMPED PINNED PHOTODIODE PIXEL ARRAY

(71) Applicant: Semiconductor Components Industries, LLC, Phoenix, AZ (US)

(72) Inventors: Chung Chun Wan, Fremont, CA (US); Xiangli Li, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 127 days.

This patent is subject to a terminal disclaimer.

(21) Appl. No.: 14/171,181

(22) Filed: Feb. 3, 2014

(65) Prior Publication Data

US 2014/0146209 A1 May 29, 2014

Related U.S. Application Data

(62) Division of application No. 13/242,865, filed on Sep. 23, 2011, now Pat. No. 8,674,282.

(51) Int. Cl.
*H01L 27/00* (2006.01)
*H01L 27/148* (2006.01)
*H01L 27/146* (2006.01)
*H04N 5/3745* (2011.01)
*H04N 5/353* (2011.01)

(52) U.S. Cl.
CPC .... *H01L 27/14887* (2013.01); *H01L 27/1461* (2013.01); *H01L 27/14612* (2013.01); *H01L 27/14654* (2013.01); *H04N 5/3532* (2013.01); *H04N 5/37452* (2013.01)

(58) Field of Classification Search
CPC .................. H01L 27/1461; H01L 27/14612
USPC ...................................... 250/208.1
See application file for complete search history.

(56) References Cited

U.S. PATENT DOCUMENTS 8,723,284 B1* 5/2014 Hynecek ............... H01L 31/103
257/228
2006/0145203 A1* 7/2006 Toros ................ H01L 27/14603
257/291

(Continued)

FOREIGN PATENT DOCUMENTS

WO WO20090125821 * 10/2009

*Primary Examiner* — Thanh Luu
(74) *Attorney, Agent, or Firm* — Zachary D. Hadd

(57) ABSTRACT

The present invention relates to a pumped pixel that includes a first photo-diode accumulating charge in response to impinging photons, a second photo-diode, and a floating diffusion positioned on a substrate. The pixel also includes a charge barrier positioned on the substrate between the first photo-diode and the second photo-diode, where the charge barrier temporarily blocks charge transfer between the first photo-diode and the second photo-diode. A pump gate may also be formed on the substrate adjacent to the charge barrier. The pump gate pumps the accumulated charge from the first photo-diode to the second photo-diode through the charge barrier. Also included is a transfer gate positioned on the substrate between the second photo-diode and the floating diffusion. The transfer gate serves to transfer the pumped charge from, the second photo-diode to the floating diffusion.

13 Claims, 12 Drawing Sheets

(56) References Cited

U.S. PATENT DOCUMENTS

2006/0261246 A1* 11/2006 Krymski .............. H04N 5/3653
                                                    250/208.1
2009/0050943 A1*  2/2009 Mauritzson ............ H04N 5/343
                                                    257/292

* cited by examiner

PUMPED PINNED PHOTODIODE PIXEL ARRAY

This application is a division of U.S. patent application Ser. No. 13/242,865, filed Sep. 23, 2011, which is a non-provisional of U.S. provisional patent application 61,467,561, filed Mar. 25, 2011, which are hereby incorporated by reference herein in their entireties. This application claims the benefit of and claims priority to U.S. patent application Ser. No. 13/242,865, filed Sep. 23, 2011 and U.S. provisional patent application 61,467,561, filed Mar. 25, 2011.

FIELD OF THE INVENTION

The present invention relates, in general, to a complementary metal oxide (CMOS) imager that includes a plurality of pumped pixels for storing pixel charge before readout.

BACKGROUND

In conventional dual pinned photo-diode pixels, one of the pinned photo-diodes is utilized as memory to store accumulated charge while reducing the effects of dark current. These conventional pixels, however, have well capacities that are limited to the difference in potential between adjacent wells. In general, a pinned photo-diode receiving charge must have a higher well potential than the well potential of a photo-diode supplying the charge. Charge transfer is performed similar to water transfer by pouring the charge from a lower well potential (shallow well depth) to a higher well potential (deep well depth). Due to limitations in voltage swing (i.e. potential between wells) in a pixel, the charge handling capacities are also limited.

BRIEF DESCRIPTION OF THE DRAWINGS

FIG. 3D is a cross-sectional view of the pumped pixel architecture showing the charge barrier positioned between the first photo-diode and the second photo-diode and the remainder of the accumulated charge pumped over the charge harrier and into the second photo-diode, according to an embodiment of the present invention.

DETAILED DESCRIPTION

As described below, the present invention provides a pumped pixel having dual photo-diodes (e.g. pinned photo-diodes) and at least one virtual charge barrier (e.g. a heavily p-doped region on the surface and an n-doped region underneath). One of the photo-diodes accumulates charge in response to impinging photons. The other photo-diode acts as a memory node that stores the accumulated charge.

In one example, the accumulated charge is pumped (by a pump gate) over the charge barrier and into the photo-diode for storage or into the floating diffusion for readout. In general, the charge barrier blocks the charge from leaking back into the photo-diode from where it was pumped. Being able to pump and store the charge may allow the imager to delay pixel readout and/or extend dynamic range without the need for large voltage differences (differences in well potentials) and/or doping between the photo-diode wells.

Figure 1A:
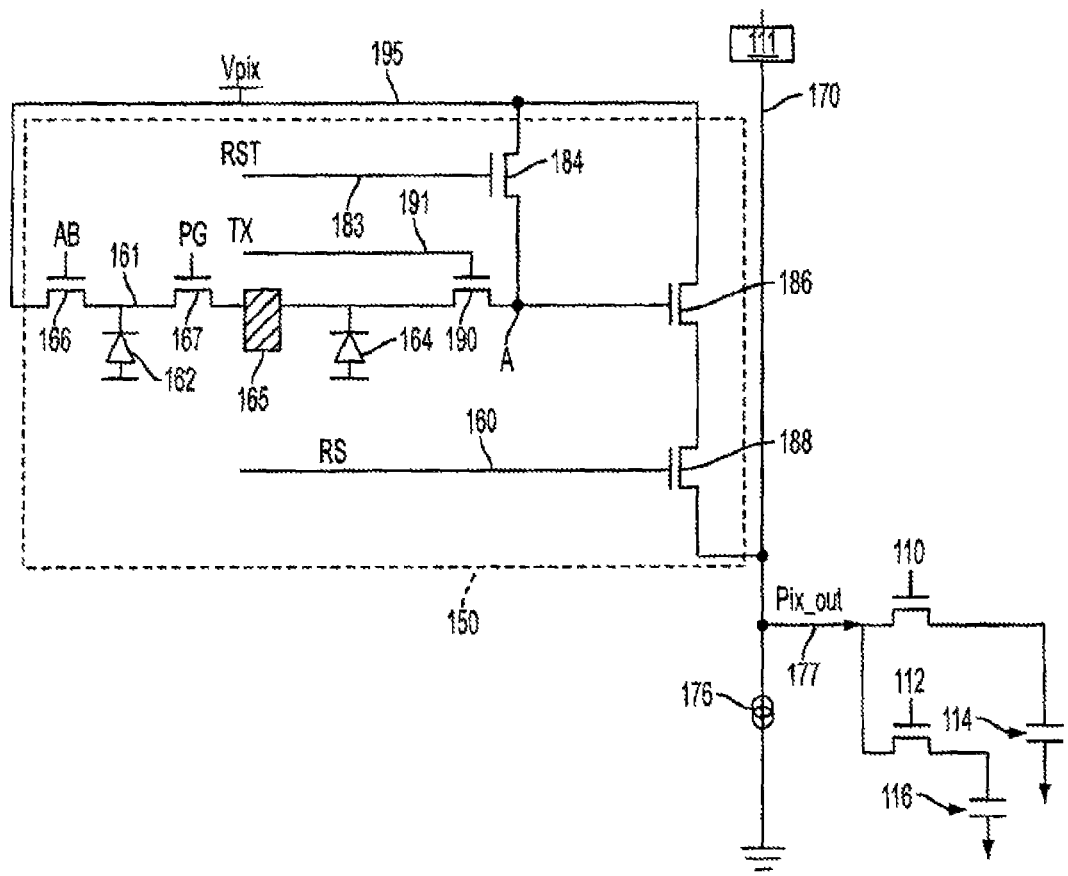
FIG. 1A is a schematic diagram of a 6 transistor (6T) pixel architecture showing the charge barrier positioned between the first photo-diode and the second photo-diode, according to an embodiment of the present invention.

A six transistor (6T) circuit for a pixel 150 of a CMOS imager is illustrated in FIG. 1A. Pixel 150 is a 6T pixel, where 6T is used to designate the use of six transistors to operate a pixel. The 6T pixel 150 has photo-sensors such as exposed pinned photo-diode 162, a shielded pinned photo-diode 164, a reset transistor 184, a transfer transistor 190, a source follower transistor 186, a row select transistor 188, an anti-blooming gate 166, a pump gate 167 and a charge harrier 165.

It is noted that FIG. 1A shows the circuitry for operation of a single pixel 150, and that in practical use, there may be an M.times.N array of pixels arranged in rows and columns with the pixels of the array accessed using row and column select circuitry, as described in more detail below.

Photodiode 162 accumulates photo-electrons generated in response to impinging photons. This accumulated charge is pumped over charge barrier 165 and into pinned photo-diode 164 for storage when activated by the PG control signal during a storage period. The stored charge is then transferred to floating diffusion stage node A through transfer transistor 190 when activated by the TX control signal during a readout period. The source follower transistor 186 has a gate terminal connected to node A and thus amplifies the signal appearing at floating diffusion node A. When a particular row containing pixel 150 is selected by an activated row select transistor 188, the signal amplified by the source follower transistor 186 is passed on a column line 170 to a column readout circuitry 242 (shown in FIG. 2). Photodiode 162 accumulates a photo-generated charge in a doped region of the substrate (i.e. in a well). It is noted that the pixel 150 may include a photo-gate or other photon to charge converting device, in lieu of a pinned photodiode, as the initial accumulator for photo-generated charge.

The gate terminal of transfer transistor 190 is coupled to a transfer control signal line 191 for receiving the TX control signal, thereby serving to control the coupling of the photodiode 164 to node A. A voltage source Vpix is coupled through reset transistor 184 to node A. The gate terminal of reset transistor 184 is coupled to a reset control line 183 for receiving the RST control signal to control the reset operation in which the voltage source Vpix is connected to node A, pinned photo-diode 164 and pinned photo-diode 162 for clearing charge.

A row select signal (RS) on a row select control line 160 is used to activate the row select transistor 188. Although not shown, the row select control line 160 may be used to provide a row select signal (RS) to all of the pixels of the same row of the array, as are the RST and TX lines. Voltage source Vpix is coupled to transistors 184 and 186 by conductive line 195. A column line 170 is coupled to all of the pixels of the same column of the array and typically has a current sink 176 at its lower end. The upper part of column line 170, outside of the pixel array, includes a pull-up circuit 111 which is used to selectively keep the voltage on column line 170 high. Maintaining a positive voltage on the column line 170 during an image acquisition phase of a pixel 150 keeps the potential in a known state on the column line 170. Signals from the pixel 150 are therefore selectively coupled to a column readout circuit through the column line 170 and through a pixel output ("Pix_out") line 177 coupled between the column line 170 and the column readout circuit.

In general, Pix_out line 177 is coupled to the sample and hold (S/H) column capacitors 114 and 116 (i.e. two capacitors per column line to perform correlated double sampling). Transistors 110 and 112 are also included to ensure that the pixel output signals (i.e. the potentials after reset and integration) are each stored on the appropriate capacitor. These two potentials are compared (i.e. subtracted from each other) to perform correlated double sampling.

In general, a value can be read from pixel 150 in a two step correlated double sampling process. Prior to a charge integration period, node A and the photo-diodes 162 and 164 are reset to a high potential by activating reset transistor 184, transfer transistor 190 and pump gate 167. Photodiode 162 can alternatively be reset to a high potential by activating anti-blooming gate 166. During the charge integration period, photodiode 162 produces a charge from incident light. This is also known as the image acquisition period. Charges may be transferred from photo-diode 162 to photo-diode 164 by activating pump gate 167. Before charge transfer, node A and photo-diode 164 are reset to a high potential by activating reset transistor 184 and transfer transistor 190 to remove parasitic charges accumulated in photo-diode 164 due to mechanisms such as dark current and light leakage.

During the readout period, node A is again reset to a high potential. The charge (i.e. reset signal) at node A after reset is readout to column line 170 via the source follower transistor 186 and row select transistor 188. Readout circuitry 242 in FIG. 2 then samples and holds the reset signal on capacitor 116. Transfer transistor 190 is then activated, and the charge from photodiode 164 is passed to node A, where the charge is amplified by source follower transistor 186 and passed to column line 170 through row select transistor 188. Readout circuitry 242 then samples and holds the integrated charge signal on capacitor 114. As a result, two different voltage signals are readout, sampled and held on capacitors 114 and 116 for further processing. Typically, all pixels in a row are readout simultaneously onto respective column lines 170.

Figure 2:
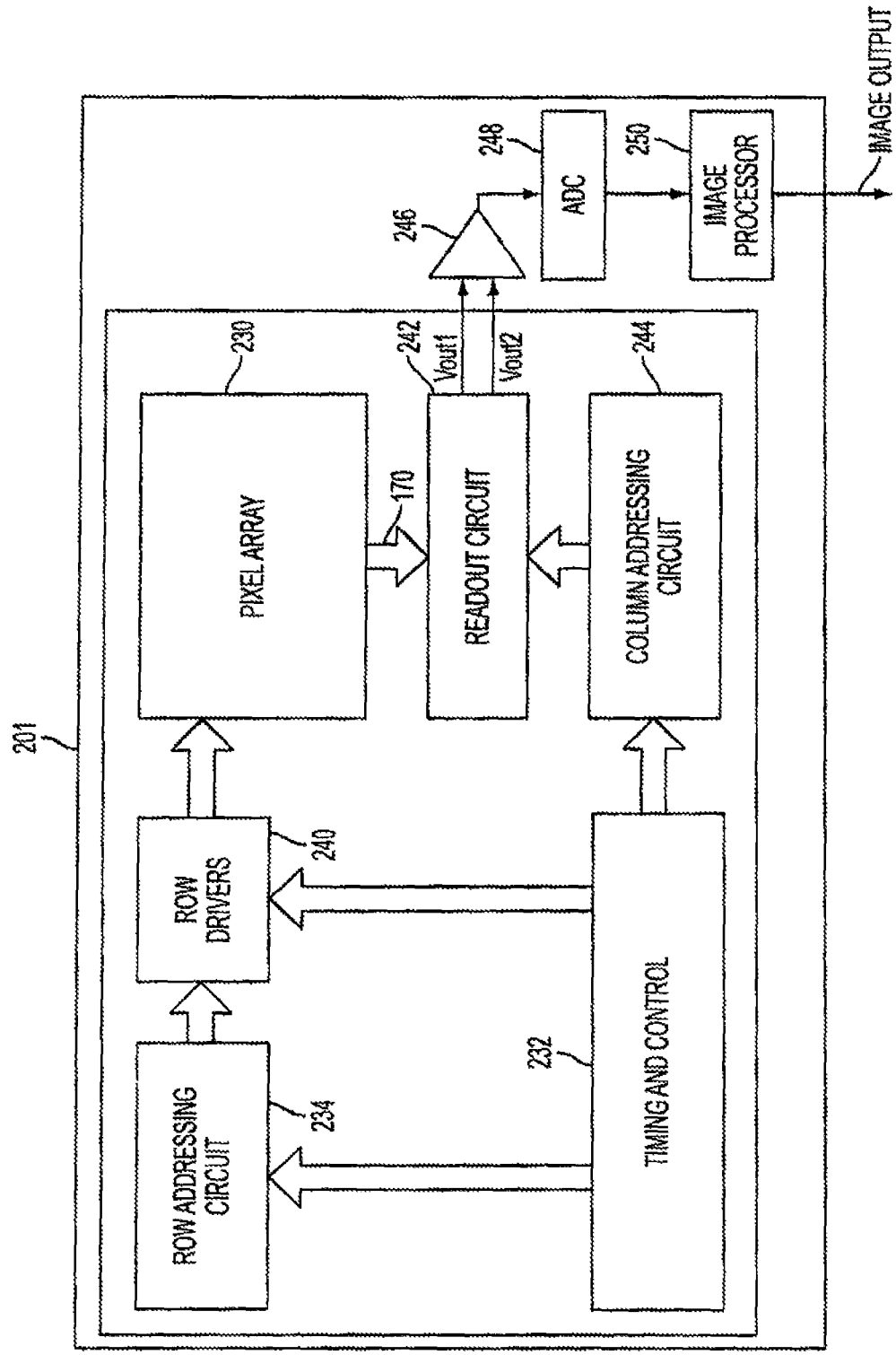
FIG. 2 is a block diagram of a complementary metal oxide semiconductor (CMOS) imager architecture, according to an embodiment of the present invention.

FIG. 2 shows an example CMOS imager integrated circuit chip 201 that includes an array 230 of pixels and a controller 232, which provides timing and control signals to enable reading out of signals stored in the pixels. Exemplary arrays have dimensions of M.times.N pixels, with the size of the array 230 depending on a particular application. In general, the pixels in the array are reset, exposed to light and readout on a row by row basis (rolling shutter mode), or all the pixels in the array are simultaneously reset, exposed to light, and then readout row by row (global shutter mode). It is noted that the present invention may be utilized in either rolling shutter mode or global shutter mode to increase dynamic range and/or delay pixel readout.

In general, the pixel signals from the array 230 are read out a row at a time using a column parallel readout architecture. The controller 232 selects a particular row of pixels in the array 230 by controlling the operation of row addressing circuit 234, row drivers 240 and column addressing circuit 244. Signals corresponding to charges stored in the selected row of pixels and reset signals are provided on the column lines 170 to a column readout circuit 242 in the manner described above. The pixel signal read from each of the columns can be read out sequentially using a column addressing circuit 244. Pixel signals (Vrst, Vsig) corresponding to the readout reset signal and integrated charge signal are provided as respective outputs Vout1, Vout2 of the column readout circuit 242 where they are subtracted in differential amplifier 246, digitized by analog to digital converter 248, and sent to an image processor circuit 250 for image processing.

Figure 1B:
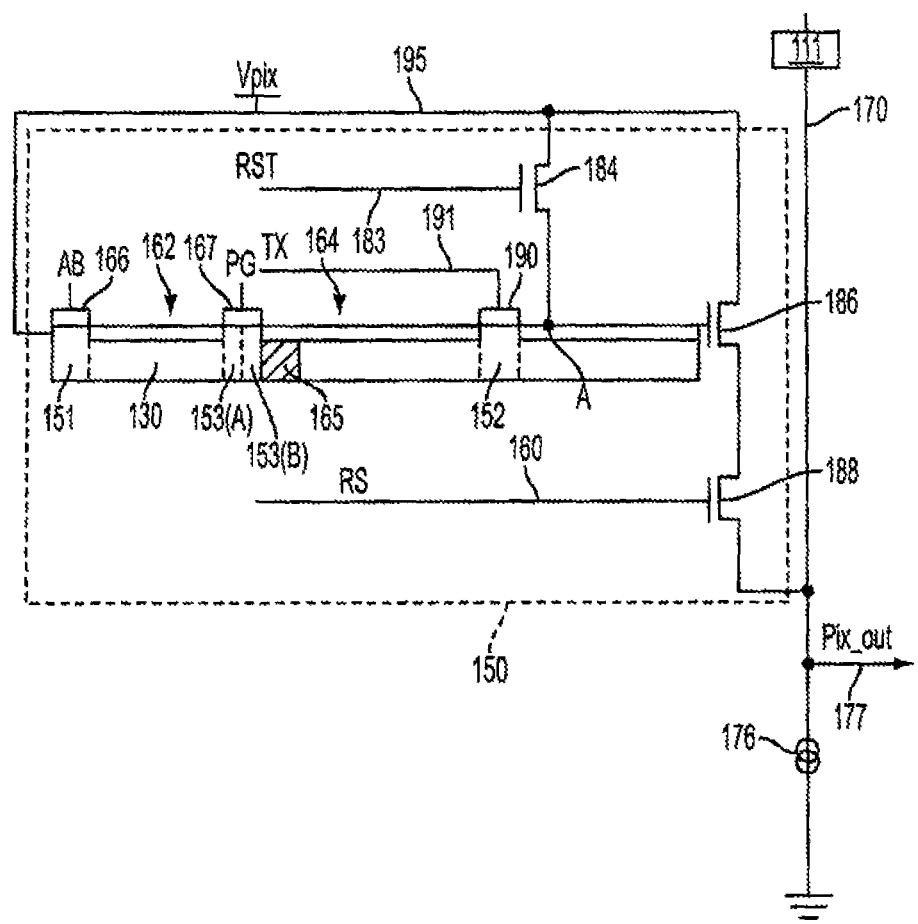
FIG. 1B is a cross-sectional vies of a 6 transistor (6T) pixel architecture partly in schematic diagram form showing the charge barrier positioned between the first photo-diode and the second photo-diode, according to an embodiment of the present invention.

Shown in FIG. 1B is a cross sectional view of a pixel substrate shown in FIG. 1A. Specifically, a substrate 130 may include pinned photo-diodes 162 and 164 separated by pump gate 167 and charge barrier 165. The regions under the photodiodes, and the regions 151, 153(A), 153(B) and 152 under the anti-bloom gate, pump gate and transfer gate respectively include charge wells for storing charge. It is noted that increasing the well potential lowers the well (makes the well deep for charge storage), whereas decreasing the well potential raises the well (makes the well shallow for blocking and/or transferring charge).

During operation, pinned photo-diode 162 accumulates charge based on impinging photons. This accumulated charge is held in pinned photodiode 162 due to raised wells 151 and 153(A). The well depths of the various gates may be modulated (raised or lowered) based on the voltage applied to the gate terminals (i.e., based on the voltage signal AB, PG and TX).

For example, during the integration period, anti-blooming gate 166 and pump gate 167 are driven by a negative voltage which raises the wells so that charge is isolated in pinned photo-diode 162. Then, during a storage period (i.e., after and/or during integration), the pump gate 167 is driven by a positive voltage to lower a clock barrier in region 153(A) and a clock well in region 153(B). In general, the clock barrier and clock well are differently doped regions under the pump gate (e.g. the clock well is doped to be deeper than the dock barrier). This allows charge from pinned photo-diode 162 to transfer (i.e. spill over) into lowered clock well 153(B). Once the clock well is filled, pump gate 167 is then driven by a negative voltage which raises clock barrier 153(A) and clock well 153(B) thereby transferring (i.e. pumping) the charge over the top of barrier 165 and into pinned photo-diode 164 for storage. In general, the clock barrier (due to being higher than the clock well) prevents charge stored in the clock well from spilling back into the first pinned photo-diode during the pumping process. During both the integration and storage period, transfer gate 190 is closed by applying a negative voltage therefore raising the transfer gate well and blocking charge from spilling into floating diffusion A. However, during a readout period, transfer gate 190 is pulsed with a high positive voltage which lowers the transfer gate well thereby transferring the stored charge from pinned photo-diode 164 and into floating diffusion A where the pixel readout procedure (described above) is performed.

In general, the substrate may be designed (i.e., doped) such that the wells in pinned photo-diode 162 and 164 have equivalent capacity. In this example, pump gate 167 is able to pump the charge from pinned photo-diode 162 over the charge barrier and into pinned photo-diode 164 regardless of the well depth of the photodiodes.

In another example, the well capacity of pinned photo-diode 164 may be greater (i.e. deeper) than the well capacity of pinned photo-diode 162. This allows for increased dynamic range. As pinned photo-diode 162 is accumulating charge, pump gate 167 may periodically (during the integration period) pump the accumulating charge into pinned photo-diode 164 (which has a deeper well than 162) thereby allowing a longer integration time where pinned photo-diode 162 accumulates with charge multiple times. It is noted that pump gate 167 may be modulated one time or multiple time during or after integration in order to pump the charge from pinned photo-diode 162 into pinned photo-diode 164. It is also noted that clock well 153(B) may be designed to have the same capacity or smaller capacity than pinned photo-diode 162 in order to transfer the charge in a single pump or in multiple repeated pumps. It is also noted that anti-blooming gate 166 is optional. Anti-blooming gate 166 allows excess charge accumulated by pinned photo-diode 162 to spill over to potential Vpix rather than spilling over into adjacent pixels. Moreover, the anti-blooming gate 166 can be used to reset photo-diode 162.

The charge barrier may he positioned between other areas of the substrate. For example, shown in FIG. 1C the charge barrier and pump gate are located between the second pinned photo-diode 164 and floating diffusion A (i.e. transfer gate and pump gate/barrier are swapped). In this example, accumulated charge in pinned photo-diode 162 may be transferred, over to pinned photo-diode 164 for storage during a storage period. Then, during a readout period, the charge stored in pinned photo-diode 164 may he pumped over charge barrier 165 into floating, diffusion A. In this example, a transfer gate has a region 153 under the gate, and pump gate has regions 152(A) and 152(B) which are the clock barrier and clock well respectively.

Figure 1C:
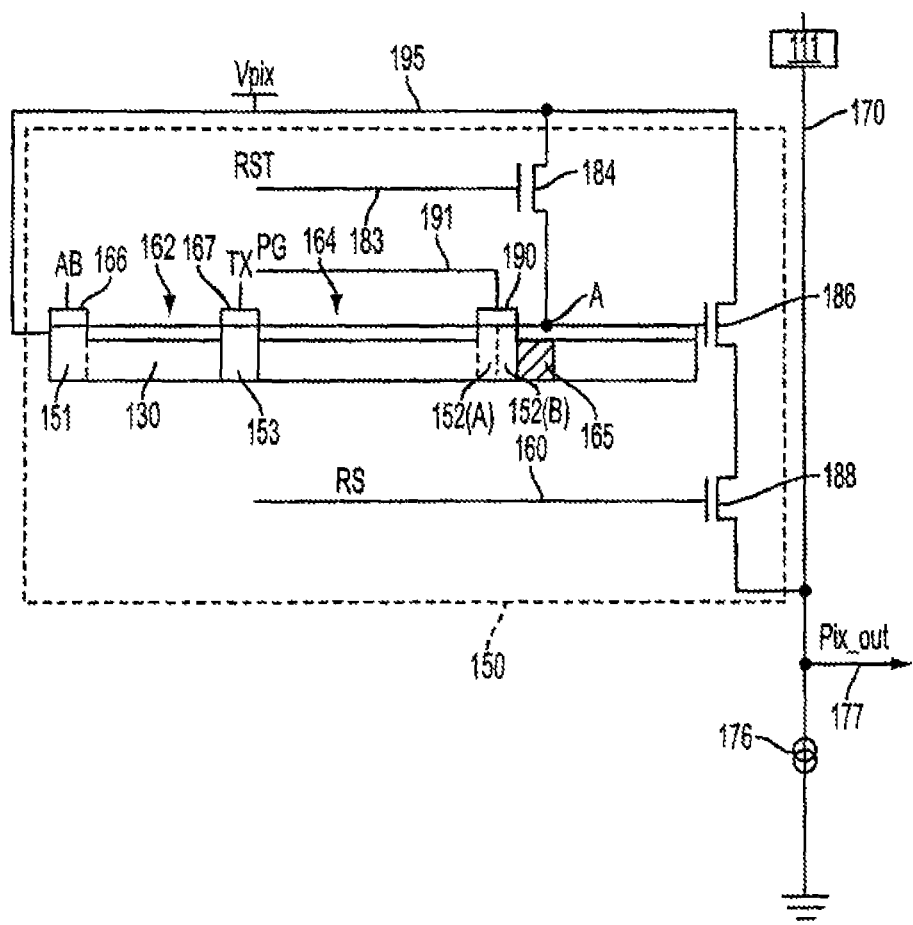
FIG. 1C is a cross-sectional view of a 6 transistor (6T) pixel architecture partly in schematic diagram form showing the charge barrier positioned between the second photo-diode and the floating diffusion, according to an embodiment of the present invention.
Figure 1D:
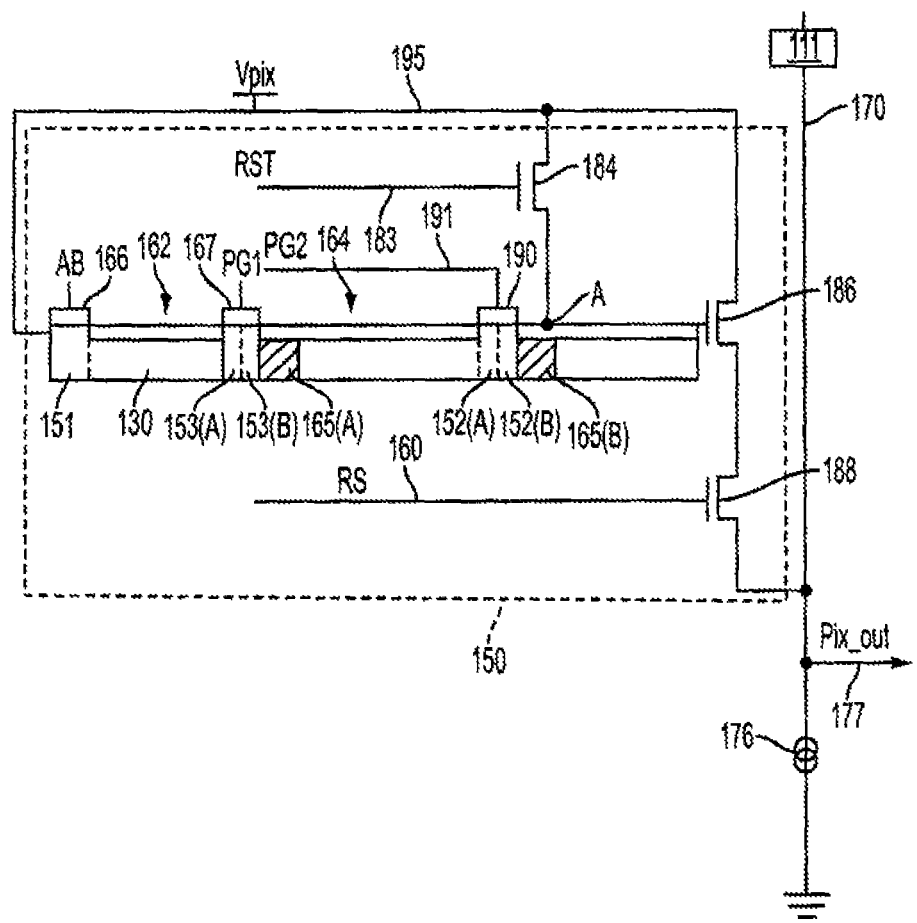
FIG. 1D is a cross-sectional view of a 6 transistor (6T) pixel architecture partly in schematic diagram form showing a first charge barrier positioned between the first photo-diode and the second photo-diode and a second charge barrier positioned between the second photo-diode and the floating diffusion, according to an embodiment of the present invention.

In another example, as shown in FIG. 1D, the pumped pixel may include two pump gates 167 and 190, and two charge barriers 165(A) and 165(B) (i.e., there may be a pump gate and charge barrier between both pinned photo-diodes and between the pinned photo-diode and the floating diffusion). In general, the first pump gate may include region 153(A) and 153(B) while the second pump gate may include regions 152(A) and 152(B) (i.e., the clock barriers and clock wells respectively). The charge barriers may be denoted as 165(A) and 165(B).

During operation, the charge accumulated by pinned photo-diode 162 may be pumped over charge barrier 165(A) and stored in pinned photo-diode 164. Then, during a readout period, the charge stored in pinned photo-diode 164 may be pumped over charge barrier 165B and into the floating diffusion A.

It is noted that in FIGS. 1B-1D, the wells of the pinned photo-diode and the floating diffusion may be designed (i.e. doped) to be shallow or deep depending on the position of the pump gate. For example, as shown in FIG. 1D, the wells for pinned photo-diode 162, 164 and floating diffusion A may be all the same depth since there is a pump between the regions. However, in another example, the wells under pinned photo-diode 164 and floating diffusion A may be deeper than that of pinned photo-diode 162 in order to store more charge and increase dynamic range of the pixel.

Shown in FIGS. 3A-3G are cross sectional views of the pumped pixels showing the flow of charge at each stage during integration, storage and readout. The operation of the pixel in FIG. 1B is now described with respect of FIGS. 3A-3G.

During an integration period, pump gate 167 and transfer gate 190 have negative voltage signals PG and TX thereby raising the dock barrier and clock well 390 and 392 and transfer well 394. During the integration time, the first pinned photo-diode 162 is accumulating charge 302. Since clock barrier 390 is raised, charge 302 is isolated in pinned photo-diode 162.

Then, during a storage period (which may be after the integration period or during the integration period), pump 167 voltage PG is increased to a positive voltage which lowers clock barrier 390 and clock well 392. When clock well 392 is lowered some or all of the charge (i.e., depending on the size of clock well 392) is transferred from the first pinned photo-diode 162 and into the clock well 392 as charge 304 (see FIG. 3B).

Figure 3A:
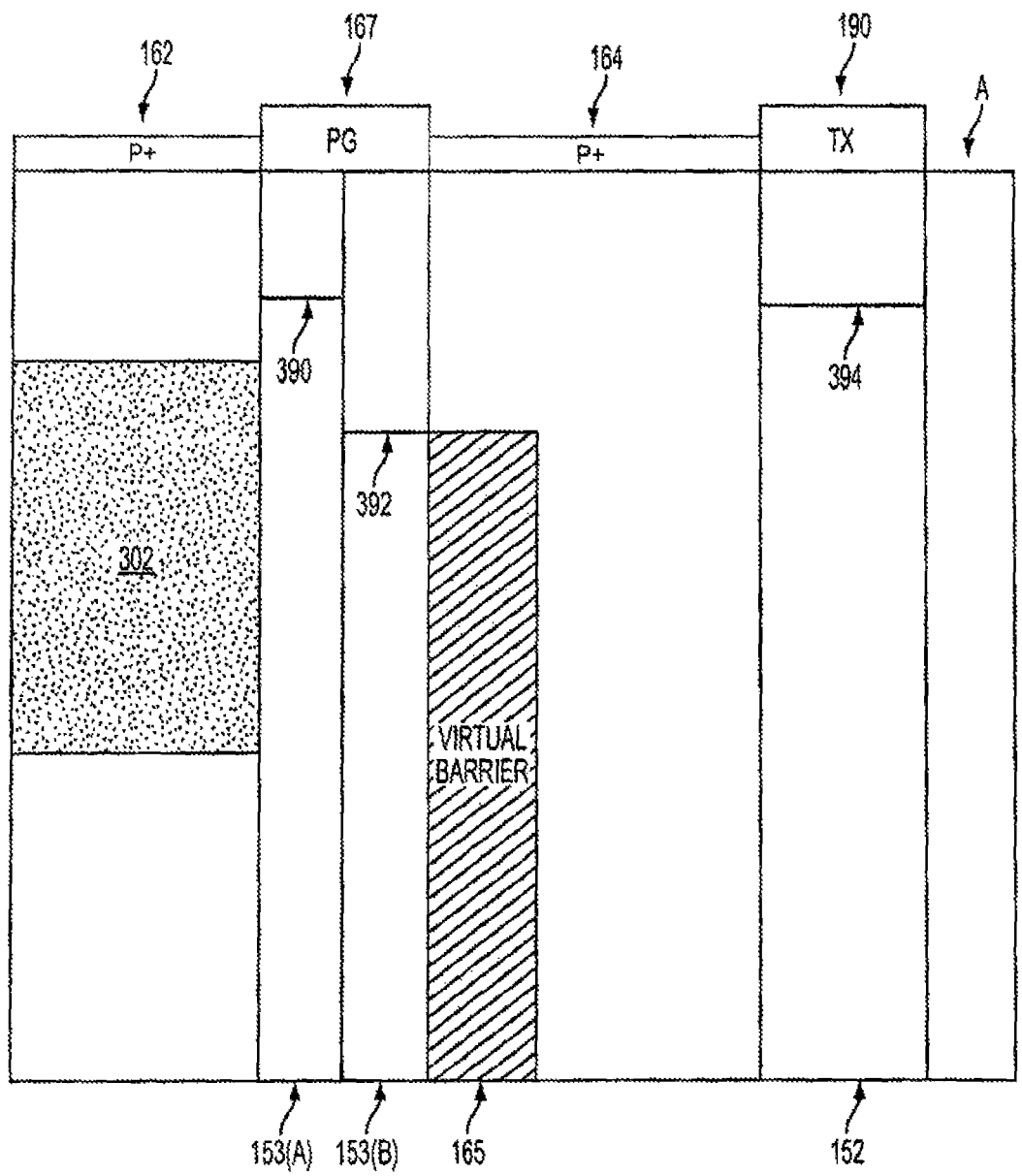
FIG. 3A is a cross-sectional view of the pumped pixel architecture showing the charge barrier positioned between the first photo-diode and the second photo-diode and charge accumulated in the first photo-diode according to an embodiment of the present invention.
Figure 3B:
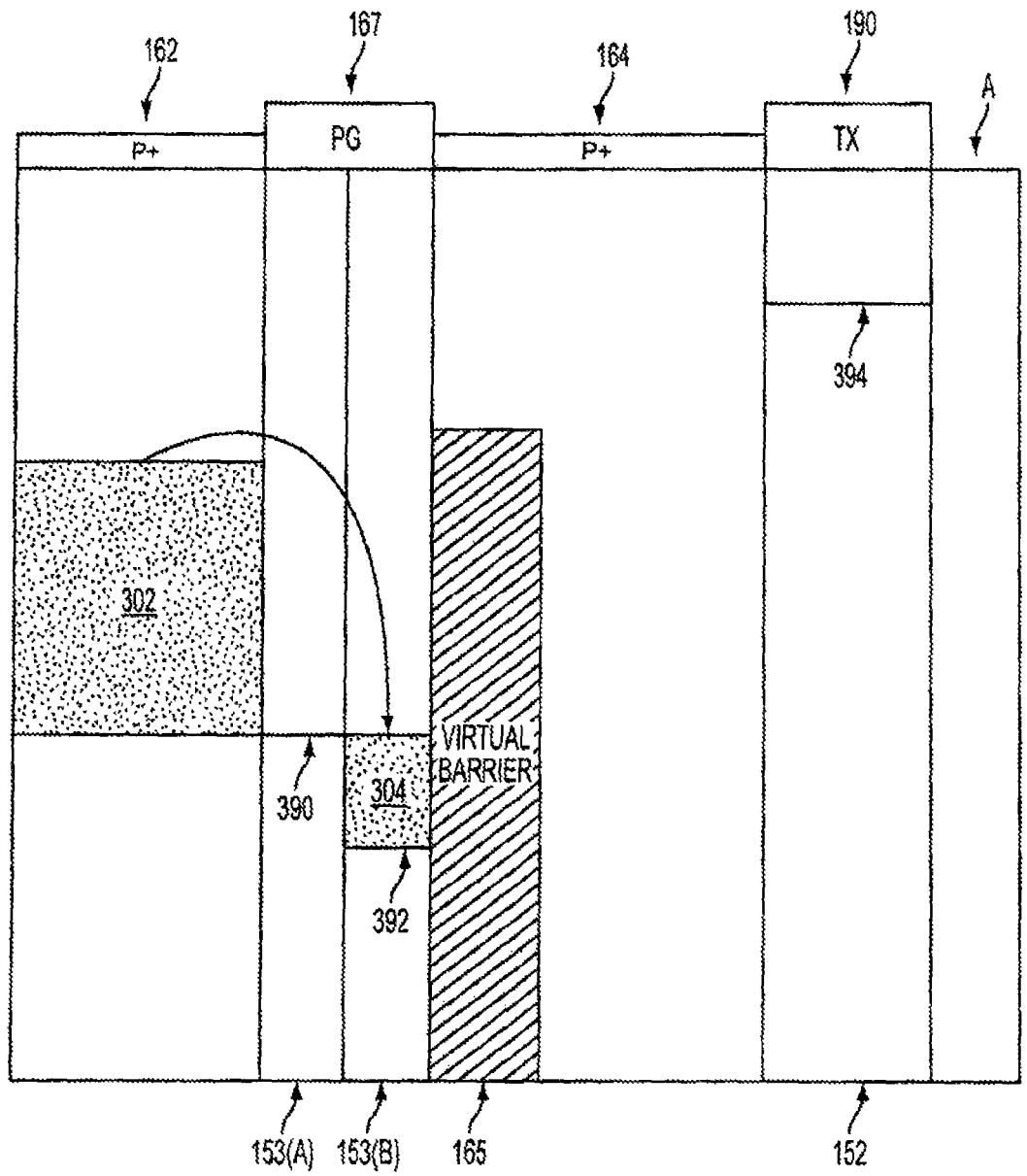
FIG. 3D is a cross-sectional view of the pumped pixel architecture showing the charge barrier positioned between the first photo-diode and the second photo-diode and charge filling the clock well of the pump gate, according to an embodiment of the present invention.
FIG. 3C is a cross-sectional view of the pumped pixel architecture showing the charge barrier positioned between the first photo-diode and the second photo-diode and a portion of the accumulated charge pumped over the charge barrier and into the second photo-diode, according to an embodiment of the present invention.
FIG. 3E is a cross-sectional view of the pumped pixel architecture showing the charge barrier positioned between the first photo-diode and the second photo-diode and the accumulated charge transferred into the floating diffusion, according to an embodiment of the present invention.
FIG. 3F is a cross-sectional view of the pumped pixel architecture showing the charge barrier positioned between the second photo-diode and the floating diffusion, according to an embodiment of the present invention.
FIG. 3G is a cross-sectional view of the pumped pixel architecture showing a first charge harrier positioned between the first photo-diode and the second photo-diode, and a second charge barrier positioned between the second photo-diode and the floating diffusion, according to an embodiment of the present invention.
Figure 3C:
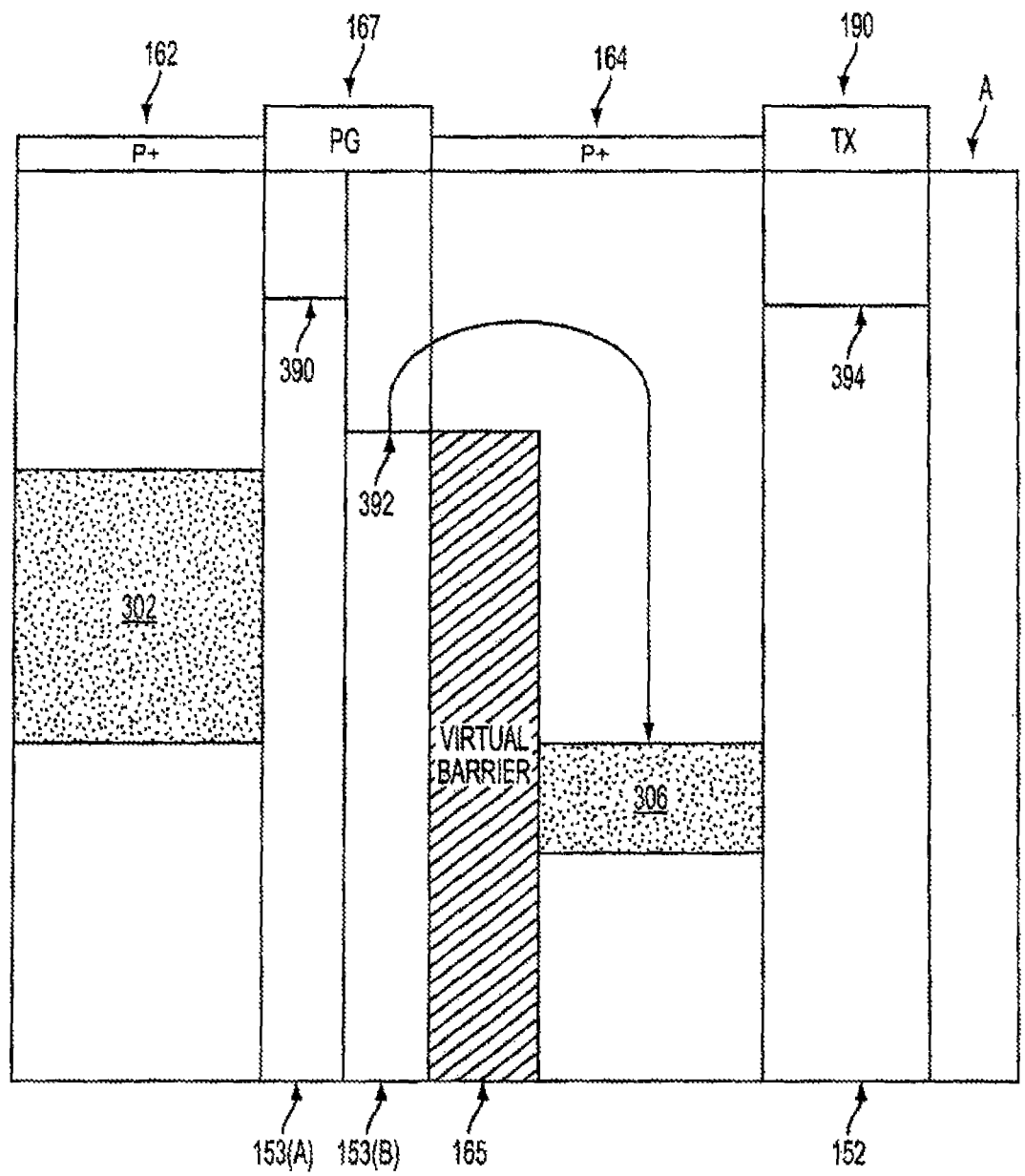
Figure 3D:
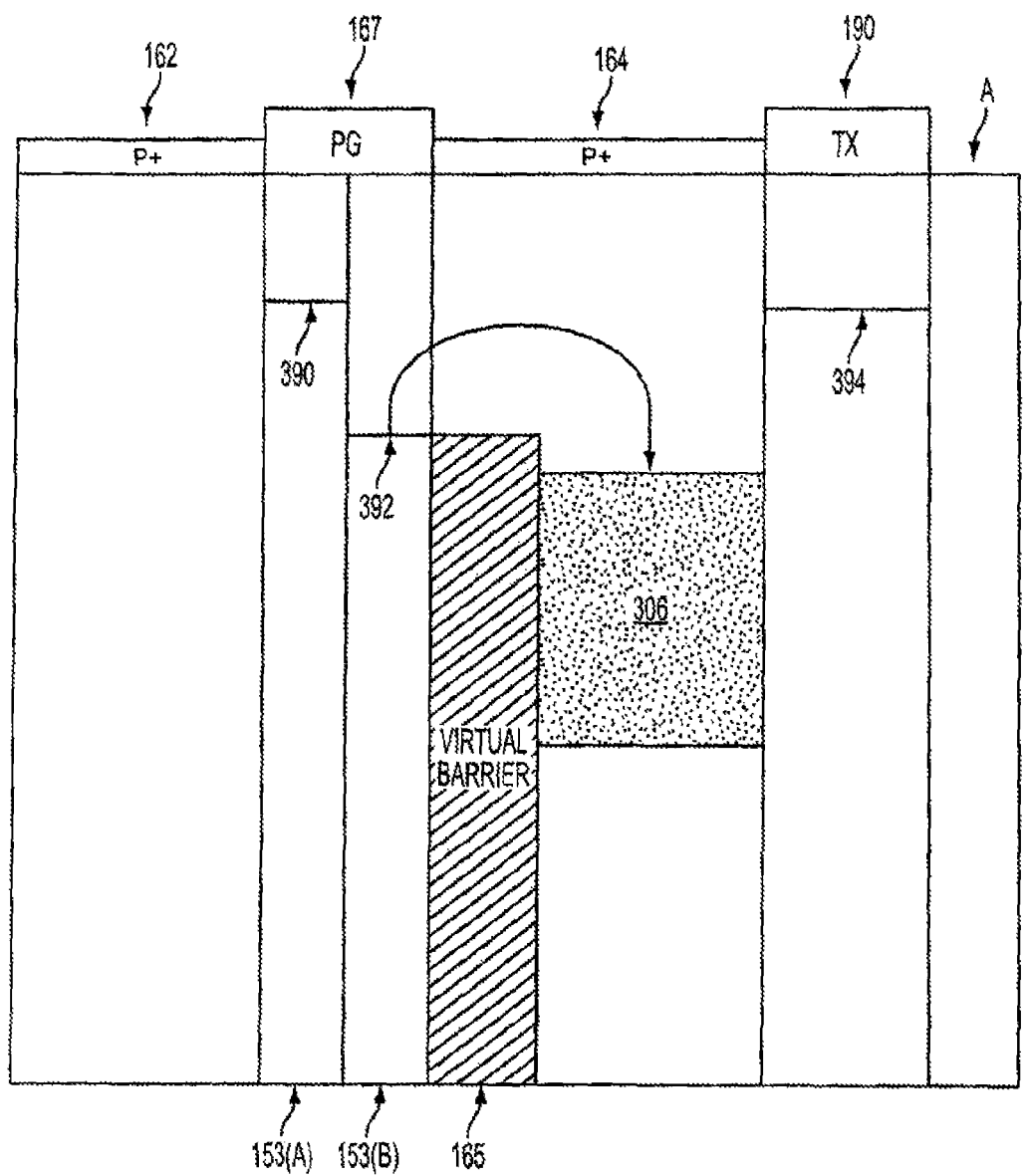

During the second half of the storage period, the pump gate 167 voltage PG is set to a negative voltage which raises clock harrier 390 and clock well 392 thereby pumping charge 304 over the top of the charge barrier and into the second pinned photo-diode 164 as charge 306 (see FIG. 3C). Since the clock well is raised (i.e. doped differently) with respect to the clock well, charge in the clock well is blocked from spilling back into the first photo-diode during pumping.

The pumping period may be repeated a plurality of times to pump all of charge 302 from the first pinned photo-diode 162 over the charge barrier and into the second pinned photo-diode 164 (charge 302 has been moved to 306). In general, charge 306 is isolated in the second pinned photo-diode 164 due to the charge barrier and the raised transfer well 394 (see FIG. 3D).

Figure 3E:
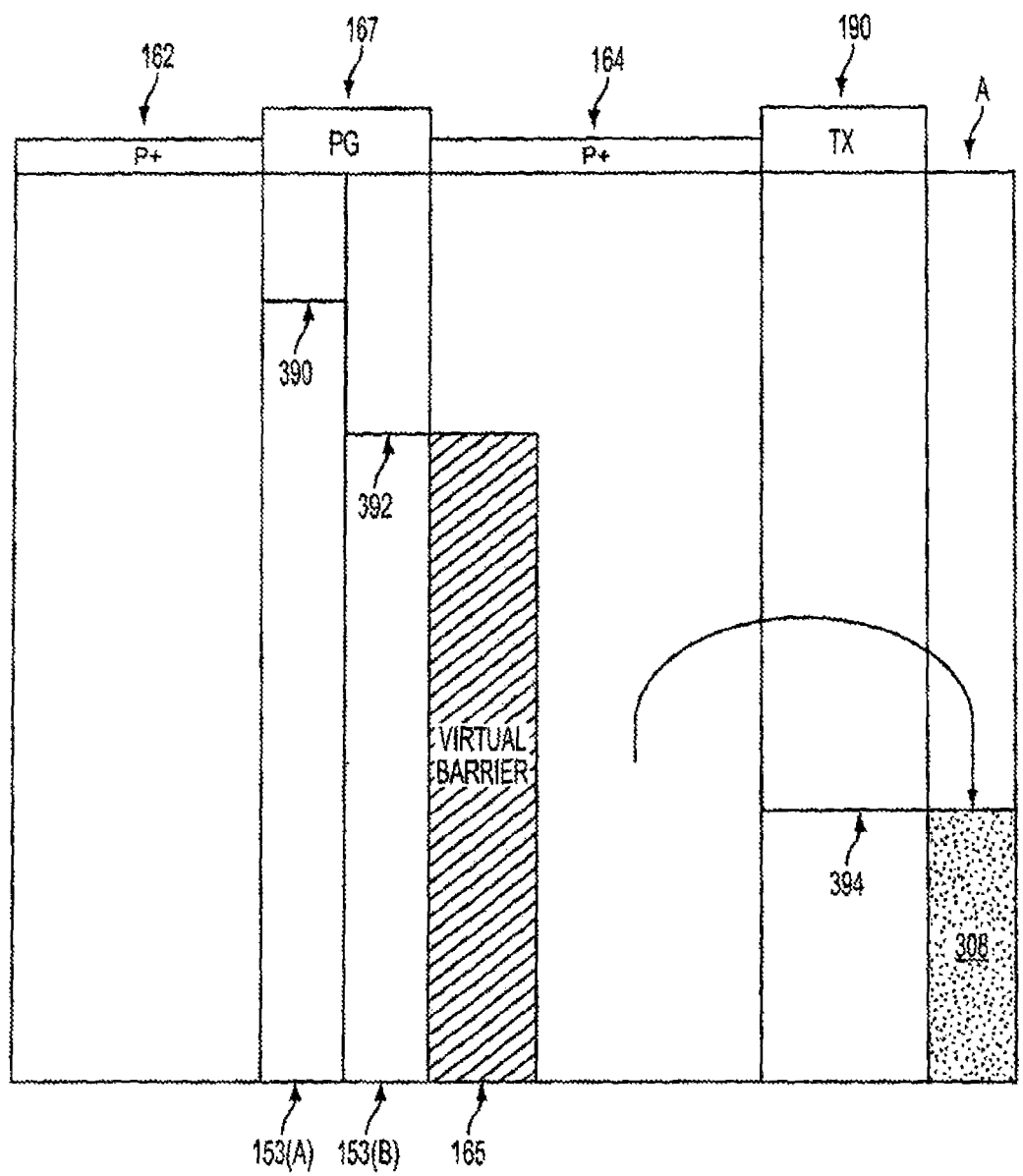

After the storage period, (i.e., during the readout period), transfer gate 190 may have its TX voltage increased to a positive voltage which lowers transfer well 394 allowing charge 306 to spill over (i.e., transfer) into floating diffusion A as charge 308 (see FIG. 3E). Once the charge 308 is transferred into the floating diffusion, the source follower transistor converts the charge to a voltage which is readout as pix_put 177 (see description of pixel readout as described above).

Figure 3F:
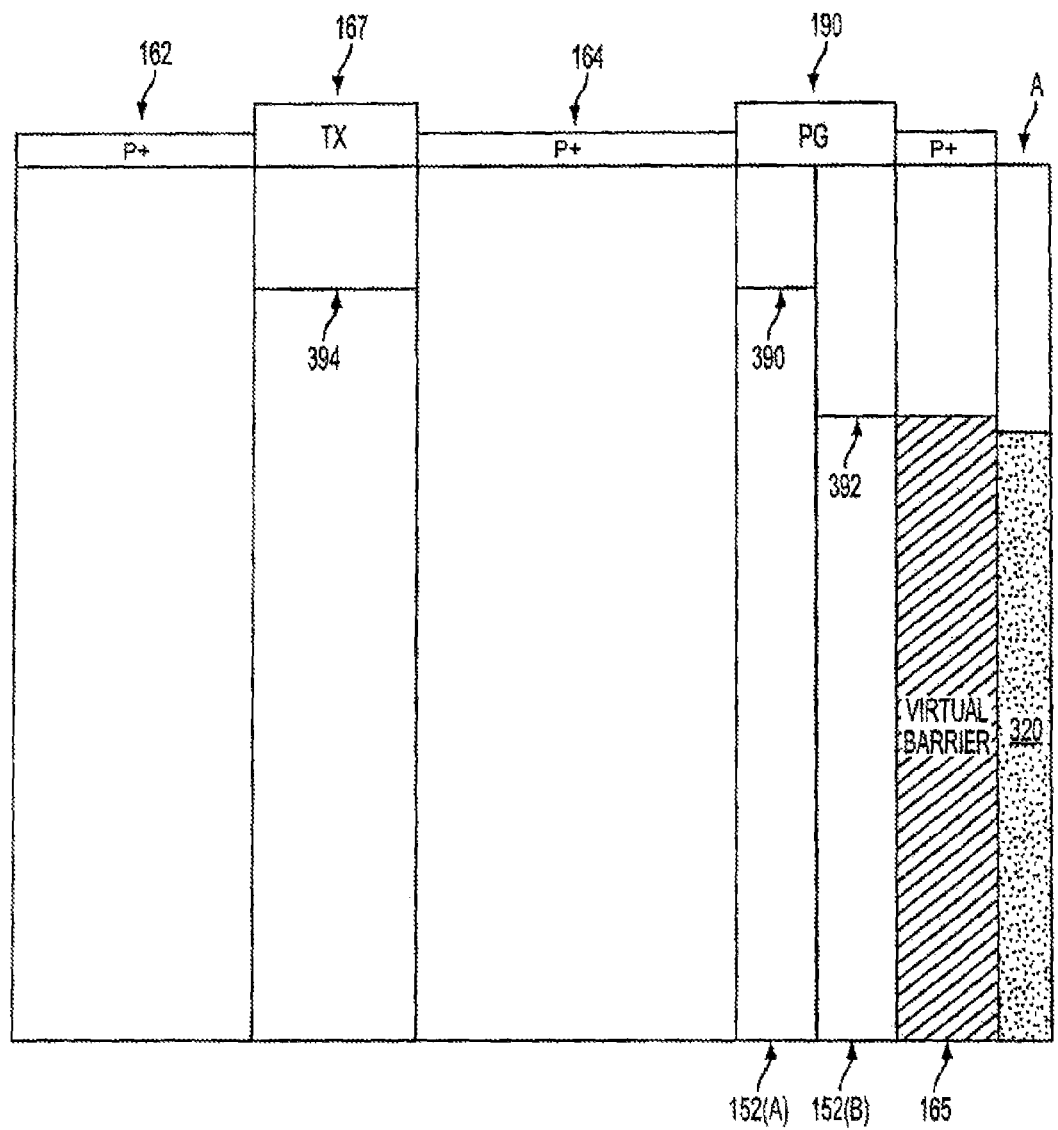

As shown in FIGS. 1C and 1D, the pump gate may be moved to different regions in the pumped pixel. For example, as shown in FIG. 3F, the pump gate and charge barrier may be swapped with the transfer gate. In this example, during an integration period, transfer gate 167 and pump gate 190 may be biased with a negative voltage which raises their respective wells allowing charge to accumulate in first photodiode 162.

During the storage period, the voltage on transfer gate 167 may be increased to a positive voltage which lowers transfer well 394 allowing charge to spill over into second photodiode 164 for storage. Then, during a readout period, the pump gate 190 may have its voltage increased to a positive voltage which lowers clock barrier 390 and clock well 392 to fill up with the charge from photodiode 164. Once a negative voltage is then applied to pump gate 190, the charge in clock well 392 will pour over the charge barrier 165 and into floating diffusion A as charge 320. As described above, the pumping may be performed in a single pump or multiple pumps depending on the amount of charge.

Figure 3G:
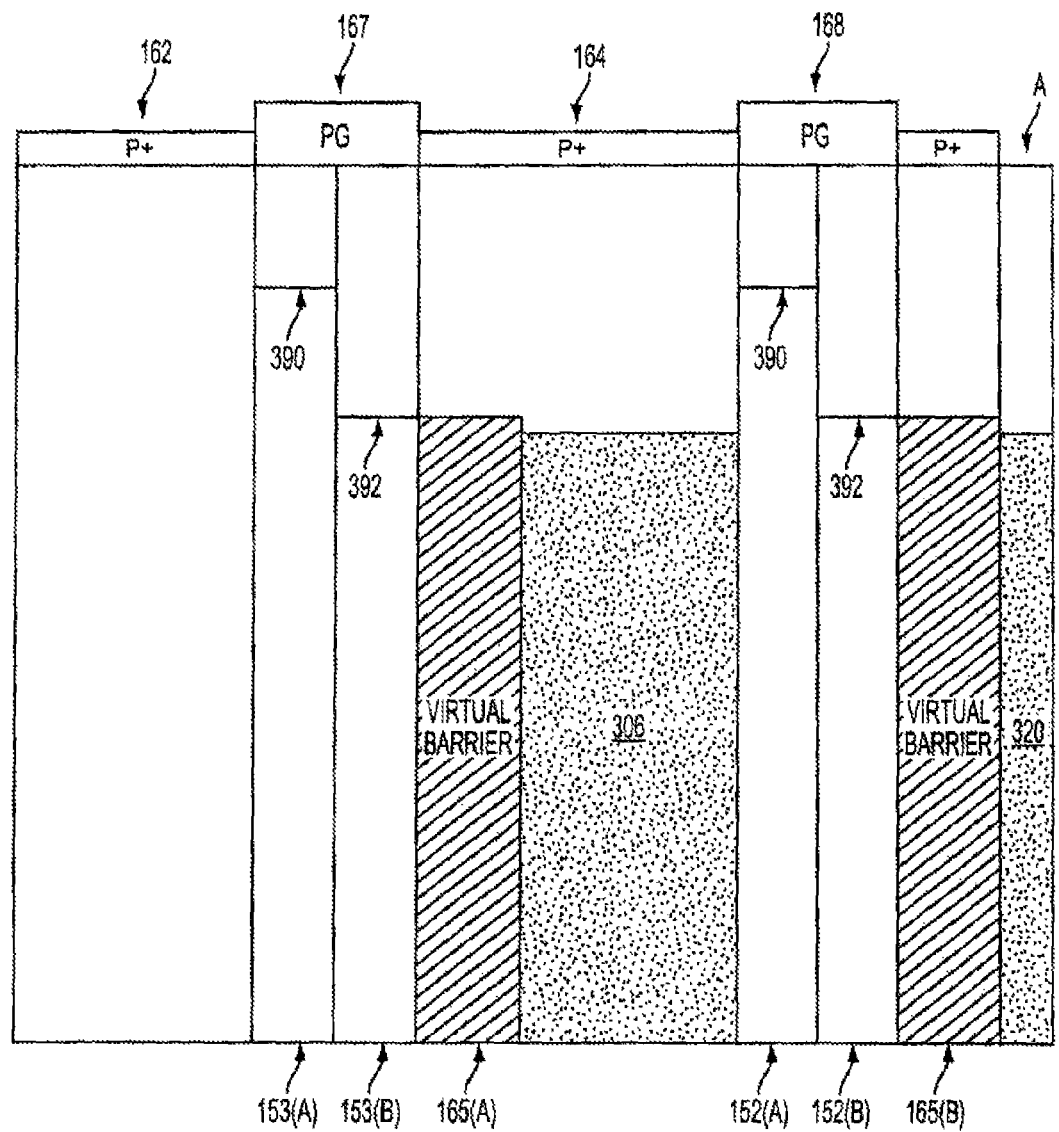

Similarly, in FIG. 3G, the transfer gate may be replaced with another pump gate (i.e., two pump gates may be utilized). During integration, pump gates 167 and 168 are held at negative voltages (i.e., their respective clock barriers and clock wells are raised therefore allowing charge to accumulate in photodiode 162). During the storage period, pump gate 167 voltage may be modulated (i.e., changed to a positive and negative voltage repeatedly) to pump the charge from pinned photo-diode 162 over charge barrier 165(A) and into pinned photo-diode 164 as charge 306. During the readout period, pump gate 168 voltage may be modulated (i.e., changed to a positive and negative voltage repeatedly) to pump the charge from pinned photo-diode 164 over charge barrier 165(B) and into the floating diffusion A as charge 320.

It is noted that the well capacities of the pinned photo-diodes, pump gates, transfer gates and floating diffusions may be designed (i.e., doped and biased) differently. For example, the charge barrier 165 may be taller or shorter depending on the doping. Similarly, the clock barrier and the clock well on the pump gate may be able to pump more or less charge depending on their relative difference with respect to each other.

As described above, the imager may operate in a rolling shutter mode or a global shutter mode. In a rolling shutter mode, three pointers may be employed (i.e., a reset pointer, a storage pointer and a read pointer). In operation, the reset pointer may traverse from the top to the bottom of the array performing a row by row pixel reset (i.e. the pinned photo-diodes, floating diffusions and gate wells for the pixels in each row are reset to a potential).

Behind the reset pointer may be one of more storage pointers which may traverse from the top to the bottom of the array transferring (i.e., pumping) the charge accumulated in the photodiode into the second pinned photo-diodes for storage. Behind the storage pointer may be a read pointer which may also traverse from the top to the bottom of the pixel array to perform row by row charge transfer of the charge from the second pinned photo-diode into the floating diffusion for read out. In one example, a storage pointer is immediately positioned before the read pointer. Other storage pointers may also be positioned before the read pointer to increase dynamic range.

The storage pointer may be beneficial in rolling shutter mode to control pixels to avoid large voltage swings and or to increase dynamic range. Specifically, the first pinned photo-diode 162 may be controlled to accumulate charge repeatedly which is then periodically transferred over the barrier and stored (using the multiple storage pointers) in a second pinned photo-diode 164.

In a global shutter mode, each pixel in every row is exposed during the integration period simultaneously, while the rows are still read out sequentially similar to the rolling shutter. Thus, in global shutter mode, a storage of each pixel value may be beneficial for delaying readout. For example, the first pinned photo-diode 162 of every pixel may accumulate charge during the integration period and then have that charge pumped into the second pinned photo-diode 164 for storage. That stored charge may then be accessed (i.e., transferred into the floating diffusion) at a later time when the pixels are read out row by row, and while the first photo-diode 162 is accumulating charge for the next image.

Accordingly, the present invention provides a pumped pixel which includes at least one pump gate and one charge barrier. In general, charge is pumped over the charge barrier by modulating a clock barrier and clock well located below the pump gate. The combination of the pump gate and charge barrier in the pumped pixel allows for adjacent photodiodes to have similar well potentials while still being able to transfer charge (i.e., large well potential differences may be avoided).

Although the invention is illustrated and described, herein with reference to specific embodiments, the invention is not intended to be limited to the details shown. Rather, various modifications may be made in the details within the scope and range of equivalents of the claims and without departing from the invention.

What is claimed is:

1. A pumped pixel, comprising:
   a photodiode that accumulates charge in response to impinging photons;
   a floating diffusion;
   a charge barrier interposed between the photodiode and the floating diffusion, wherein the charge barrier temporarily blocks charge transfer between the photodiode and the floating diffusion;
   an additional charge barrier interposed between the charge barrier and the photodiode;
   an additional photodiode interposed between the charge barrier and the additional charge barrier, wherein the additional charge barrier temporarily blocks charge transfer between the photodiode and the additional photodiode; and
   a first pump gate formed adjacent to the charge barrier, wherein the first pump gate pumps charge from the additional photodiode to the floating diffusion over the charge barrier.

2. The pumped pixel defined in claim 1, further comprising:
   a second pump gate formed adjacent to the additional charge barrier, wherein the second pump gate pumps charge from the photodiode to the additional photo-diode over the additional charge barrier.

3. The pumped pixel defined in claim 2, wherein the pumped pixel comprises one pumped pixel in an array of pumped pixels on an image device, and wherein during a rolling shutter mode of the image device, for each of the pumped pixels in a selected row of the array, a controller:
applies a reset voltage to the photodiode and the floating diffusion; and
applies a positive and a negative voltage to the first pump gate to transfer the charge from the additional photodiode towards the floating diffusion.

4. The pumped pixel defined in claim 2, wherein the pumped pixel comprises one pumped pixel in an array of pumped pixels on an image device, and wherein during a global shutter mode of the image device, a controller:
simultaneously applies a reset voltage to the photodiode and the floating diffusion for every pumped pixel in the array; and
applies a positive and a negative voltage to the first pump gate to transfer the charge from the additional photodiode towards the floating diffusion for every pumped pixel in a selected row in the array.

5. A pumped pixel, comprising:
a photodiode;
a floating diffusion formed in a substrate;
a charge barrier formed in the substrate between the photodiode and the floating diffusion; and
a pump gate formed in the substrate adjacent to the charge barrier, wherein the pump gate pumps charge from the photodiode towards the floating diffusion over the charge barrier, wherein the photodiode has a well for storing charge, and wherein the substrate below the pump gate has a clock well for storing charge and a clock barrier to block the charge in the clock well from transferring back towards the photodiode.

6. The pumped pixel defined in claim 5, further comprising:
an additional photodiode, wherein the charge barrier is formed between the additional photodiode and the floating diffusion.

7. The pumped pixel defined in claim 6, further comprising:
an additional charge barrier formed between the photodiode and the additional photodiode, wherein the additional charge barrier temporarily blocks charge transfer between the photodiode and the additional photodiode.

8. The pumped pixel defined in claim 7, further comprising:
an additional pump gate formed adjacent to the additional charge barrier, wherein the additional pump gate pumps accumulated charge from the photodiode to the additional photodiode over the additional charge barrier.

9. The pumped pixel defined in claim 8, wherein a CMOS imager includes an array of pumped pixels, and wherein during a rolling shutter mode of the imager, for each of the pumped pixels in a selected row of the array, a controller:
applies a reset voltage to the floating diffusion, the photodiode, and the additional photodiode to clear stored charge;
repeatedly applies a positive and then a negative voltage to the additional pump gate to transfer accumulated charge from the photodiode over the additional charge barrier into the additional photodiode; and
repeatedly applies a positive and then a negative voltage to the pump gate to transfer stored charge from the additional photodiode over the charge barrier into the floating diffusion.

10. The pumped pixel defined in claim 8, wherein a CMOS image includes an array of pumped pixels, and wherein during a global shutter mode of the imager, a controller:
applies a reset voltage to the floating diffusion, the photodiode, and the additional photodiode in every pumped pixel in the array to simultaneously clear stored charge;
applies a negative and positive voltage to the additional pump gate of every pumped pixel in the array to simultaneously transfer accumulated charge from the photodiode over the additional charge barrier into the additional photodiode; and
applies a positive and negative voltage to the pump gate of every pumped pixel in a selected row in the array to transfer stored charge from the additional photodiode over the charge barrier into the floating diffusion.

11. The pumped pixel defined in claim 8, wherein the photodiode and the additional photodiode have wells for storing charge, wherein the substrate below the additional pump gate has an additional clock well for storing charge and an additional clock barrier to block the charge in the additional clock well from transferring back into the photodiode, and wherein the clock barrier blocks the charge in the clock well from transferring back into the additional photodiode.

12. A method of operating a pumped pixel that includes a photodiode, a floating diffusion, a pump gate, a charge barrier associated with the pump gate, an additional photodiode, an additional pump gate, and an additional charge barrier associated with the additional pump gate, the method comprising:
with the photodiode, accumulating charge in response to impinging photons;
with the pump gate, pumping charge from the photodiode towards the floating diffusion over the charge barrier by applying a positive and negative voltage to the pump gate to transfer the charge from the photodiode towards the floating diffusion while the negative voltage is applied;
with the additional pump gate, pumping charge from the photodiode over the additional charge barrier into the additional photodiode, wherein pumping charge from the photodiode towards the floating diffusion with the pump gate comprises pumping charge from the additional photodiode over the charge barrier into the floating diffusion with the pump gate; and
reading charge out from the floating diffusion.

13. The method defined in claim 12, wherein the pumped pixel comprises one pumped pixel in an array of pumped pixels on an imager, and wherein the imager is operated in a global shutter mode, the method further comprising:
simultaneously applying a reset voltage to the photodiode and the floating diffusion for every pumped pixel in the array; and
applying the positive and negative voltage to the pump gate to transfer the charge from the photodiode towards the floating diffusion for every pumped pixel in a selected row in the array.

* * * * *